United States Patent
Ashizawa et al.

(10) Patent No.: US 10,087,109 B2
(45) Date of Patent: Oct. 2, 2018

(54) STRUCTURE

(71) Applicant: TOTO LTD., Kitakyushu-Shi, Fukuoka (JP)

(72) Inventors: Hiroaki Ashizawa, Kitakyushu (JP); Masakatsu Kiyohara, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 0 days.

(21) Appl. No.: 15/716,847

(22) Filed: Sep. 27, 2017

(65) Prior Publication Data

US 2018/0127319 A1    May 10, 2018

(30) Foreign Application Priority Data

Nov. 10, 2016 (JP) .................. 2016-219787
Sep. 22, 2017 (JP) .................. 2017-182304

(51) Int. Cl.

| | |
|---|---|
| *C04B 35/50* | (2006.01) |
| *C04B 35/553* | (2006.01) |
| *H01J 37/32* | (2006.01) |
| *C04B 35/515* | (2006.01) |

(52) U.S. Cl.
CPC .... *C04B 35/5156* (2013.01); *H01J 37/32495* (2013.01); *C04B 2235/445* (2013.01); *C04B 2235/76* (2013.01); *C04B 2235/781* (2013.01)

(58) Field of Classification Search
CPC ............... C04B 35/5156; C04B 35/553; H01J 37/32495
See application file for complete search history.

(56) References Cited

U.S. PATENT DOCUMENTS

| | | | |
|---|---|---|---|
| 9,388,485 B2 * | 7/2016 | Fukagawa | C23C 4/10 |
| 9,914,993 B2 * | 3/2018 | Ibe | C23C 4/04 |
| 9,969,652 B2 * | 5/2018 | Yano | C04B 35/50 |
| 2015/0096462 A1 * | 4/2015 | Fukagawa | C23C 4/10 |
| | | | 106/14.05 |
| 2016/0244868 A1 * | 8/2016 | Ibe | C23C 4/04 |
| 2016/0326058 A1 * | 11/2016 | Nagayama | C23C 4/04 |
| 2016/0326059 A1 * | 11/2016 | Nagayama | C04B 35/505 |
| 2017/0305796 A1 * | 10/2017 | Yano | C04B 35/50 |

\* cited by examiner

*Primary Examiner* — Karl E Group
(74) *Attorney, Agent, or Firm* — Carrier Blackman & Associates, P.C.; Joseph P. Carrier; William D. Blackman

(57) ABSTRACT

According to one embodiment, a structure includes a polycrystalline substance of yttrium oxyfluoride as a main component. The yttrium oxyfluoride has an orthorhombic crystal structure, and an average crystallite size of the polycrystalline substance is less than 100 nanometers. When taking a peak intensity detected near diffraction angle $2\theta=32.0°$ by X-ray diffraction as $\gamma$, and taking a peak intensity detected near diffraction angle $2\theta=32.8°$ as $\delta$, a peak intensity ratio $\gamma/\delta$ is not less than 0% and not more than 150%.

9 Claims, 4 Drawing Sheets

| SOURCE MATERIAL | D50(μm) | OXYGEN CONTENT(wt%) |
|---|---|---|
| F1 | 1.0 | 0 |
| F2 | 0.7 | 0 |
| F3 | 0.4 | 0 |
| F4 | 9.9 | 0 |
| F5 | 1.0 | 6 |
| F6 | 0.8 | 6 |
| F7 | 1.5 | 10 |
| F8 | 3.2 | 11.2 |
| F9 | 2.0 | 11.2 |
| F10 | 1.5 | 11.2 |
| F11 | 1.0 | 11.2 |

| | SOURCE MATERIAL | FILM MANUFACTURING CONDITION | | STRUCTURE | |
|---|---|---|---|---|---|
| | | GAS | FLOW RATE (L/min) | $\alpha/\beta$ | PLASMA RESISTANCE |
| SAMPLE 1 | F3 | N₂ | 10 | 90% | ◎ |
| SAMPLE 2 | F3 | He | 5 | 95% | ◎ |
| SAMPLE 3 | F2 | He | 5 | 76% | ○ |
| SAMPLE 4 | F2 | N₂ | 10 | 71% | ○ |
| SAMPLE 5 | F4 | He | 5 | 51% | ○ |
| SAMPLE 6 | F4 | N₂ | 10 | 51% | ○ |
| SAMPLE 7 | F1 | He | 5 | 74% | ○ |
| SAMPLE 8 | F1 | N₂ | 10 | 71% | ○ |
| SAMPLE 9 | F3 | N₂ | 2.5 | 69% | ○ |
| SAMPLE 10 | F4 | N₂ | 2.5 | 56% | ○ |
| SAMPLE 11 | F2 | N₂ | 2.5 | 113% | × |
| SAMPLE 12 | F7 | N₂ | 10 | - | ◎ |
| SAMPLE 13 | F7 | He | 5 | - | ◎ |
| SAMPLE 14 | F6 | N₂ | 10 | 71% | ○ |
| SAMPLE 15 | F6 | He | 5 | 72% | ○ |
| SAMPLE 16 | F5 | He | 5 | 65% | ○ |
| SAMPLE 17 | F5 | N₂ | 10 | 77% | ○ |
| SAMPLE 18 | F5 | N₂ | 2.5 | 85% | ○ |
| SAMPLE 19 | F6 | N₂ | 2.5 | 100% | × |
| SAMPLE 20 | F8 | N₂ | 10 | - | ○ |
| SAMPLE 21 | F9 | N₂ | 10 | - | ◎ |
| SAMPLE 22 | F10 | N₂ | 10 | - | ◎ |
| SAMPLE 23 | F11 | N₂ | 10 | - | ◎ |
| SAMPLE 24 | F11 | N₂ | 2.5 | - | × |

FIG. 3

|  | SOURCE MATERIAL | FILM MANUFACTURING CONDITION || STRUCTURE ||
|  |  | GAS | FLOW RATE (L/min) | $\gamma/\delta$ | PLASMA RESISTANCE |
|---|---|---|---|---|---|
| SAMPLE 12 | F7 | $N_2$ | 10 | 102% | ◎ |
| SAMPLE 13 | F7 | He | 5 | 100% | ◎ |
| SAMPLE 14 | F6 | $N_2$ | 10 | 74% | ○ |
| SAMPLE 15 | F6 | He | 5 | 107% | ○ |
| SAMPLE 16 | F5 | He | 5 | 62% | ○ |
| SAMPLE 17 | F5 | $N_2$ | 10 | 83% | ○ |
| SAMPLE 18 | F5 | $N_2$ | 2.5 | 77% | ○ |
| SAMPLE 19 | F6 | $N_2$ | 2.5 | 156% | × |
| SAMPLE 20 | F8 | $N_2$ | 10 | 61% | ○ |
| SAMPLE 21 | F9 | $N_2$ | 10 | 72% | ◎ |
| SAMPLE 22 | F10 | $N_2$ | 10 | 88% | ◎ |
| SAMPLE 23 | F11 | $N_2$ | 10 | 45% | ◎ |
| SAMPLE 24 | F11 | $N_2$ | 2.5 | 249% | × |

STRUCTURE

CROSS-REFERENCE TO RELATED APPLICATIONS

This application is based upon and claims the benefit of priority from Japanese Patent Application No. 2016-219787, filed on Nov. 10, 2016, and the priority from Japanese Patent Application No. 2017-182304, filed on Sep. 22, 2017; the entire contents of which are incorporated herein by reference.

FIELD

Embodiments of the invention relate generally to a structure.

BACKGROUND

As a member used under a plasma irradiation environment such as a semiconductor manufacturing apparatus, a member having a highly plasma resistant coat formed on the surface of the member is used. The coat is based on, for example, an oxide such as alumina ($Al_2O_3$), yttria ($Y_2O_3$) or the like, or a nitride such as aluminum nitride (AlN) or the like.

On the other hand, in an oxide-based ceramics, a volume of a film expands and a crack or the like occurs with fluoridation due to a reaction with a CF-based gas, and as a result, particles are generated, therefore use of fluoride-based ceramics such as originally fluoridated yttrium fluoride ($YF_3$) or the like is proposed (JP 2013-140950 A (Kokai)). A thermal sprayed material made of granules including oxyfluoride of yttrium and $YF_3$ and a plasma resistant coating based on $YF_3$ are proposed (JP 2014-009361 A (Kokai), JP 2016-076711 A (Kokai)).

Since $YF_3$ is decomposed, for example, at a high temperature of approximately 1000° C. to 1100° C., a sintering temperature when manufacturing a sintered body of $YF_3$ is supposed to be up to, for example, approximately 800° C. (JP 2003-146755 A (Kokai)) However, when the sintering temperature is low, it is difficult to increase a density sufficiently. Fluorine gas generated in the sintering is toxic, and has a safety problem as well. Then, the structure of $YF_3$ is manufactured by a method of a thermal spray or the like. However, it is difficult to manufacture the structure including $YF_3$ with a sufficient density by the thermal spray, and there is a problem of being inferior in the plasma resistance.

It is also considered that rare-earth oxyfluoride is used, with expectation of having resistance to both of CF-based plasma and Cl-based plasma.

For example, it is considered that a sintered body including oxyfluoride of yttrium is sintered under inactive atmosphere such as vacuum or nitrogen atmosphere (Japanese Patent No. 4160224, Japanese Patent No. 5911036). This method can suppress mixing of yttria ($Y_2O_3$) into the obtained sintered body by sintering under the inactive atmosphere. However, in the sintered body, there is a problem that a crystal forming particle becomes large due to grain growth accompanying sintering and thus the particle tends to be large.

For example, it is also considered that a thermal spray film is formed by using oxyfluoride of a rare-earth element as a source material (Japanese Patent No. 5927656). However, in the thermal spray, oxide is produced by oxygen in the atmosphere upon heating. Therefore, $Y_2O_3$ may be mixed in the obtained thermal spray film and control of compositions may be difficult. The thermal spray film has yet a problem in denseness.

On the other hand, JP 2016-027624 A (Kokai) discloses that it is possible to form the highly plasma resistant structure of $Y_2O_3$ at a normal temperature by an aerosol deposition method. It is possible to manufacture a film at the normal temperature by formation method of the structure based on mechanical shock such as the aerosol deposition method or the like. For this reason, it is possible to fabricate safely the structure including a compound including yttrium and fluorine by the aerosol deposition method without fear of thermal decomposition and influence of toxic fluorine gas.

BRIEF DESCRIPTION OF THE DRAWINGS

FIG. 3 is a table illustrating samples of the structure;

DETAILED DESCRIPTION

Figures 1, 2:
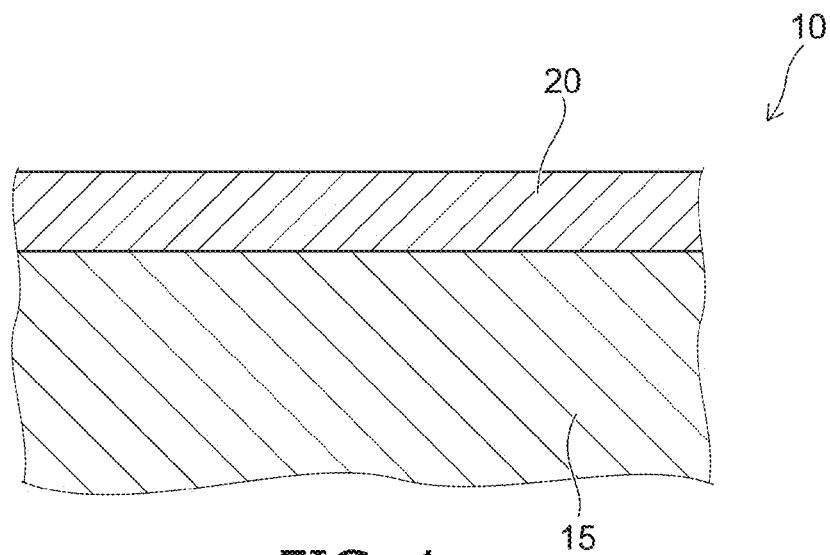
FIG. 1 is a cross-sectional view illustrating a member including a structure according to an embodiment.
FIG. 2 is a table illustrating source materials of the structure.

The first invention is a structure including a polycrystalline substance of yttrium oxyfluoride as a main component, the yttrium oxyfluoride having an orthorhombic crystal structure, and an average crystallite size of the polycrystalline substance being less than 100 nanometers, when taking a peak intensity detected near diffraction angle $2\theta=32.0°$ by X-ray diffraction as γ, and taking a peak intensity detected near diffraction angle $2\theta=32.8°$ as δ, a peak intensity ratio γ/δ being not less than 0% and not more than 150%.

The inventors of the invention have found the relationship between the peak intensity ratio γ/δ and the plasma resistance. The plasma resistance can be increased by setting the peak intensity ratio γ/δ to be not less than 0% and not more than 150%.

The second invention is a structure including a polycrystalline substance of yttrium fluoride, an average crystallite size in the polycrystalline substance being less than 100 nanometers, when taking a peak intensity detected near diffraction angle $2\theta=24.3°$ by X-ray diffraction as α, and taking a peak intensity detected near diffraction angle $2\theta=25.7°$ as β, a peak intensity ratio α/β being not less than 0% and less than 100%.

The inventors of the application have found the relationship between the peak intensity ratio α/β and the plasma resistance. The plasma resistance can be increased by setting the peak intensity ratio α/β to be not less than 0% and less than 100%.

The third invention is the structure in the first invention, wherein the peak intensity ratio γ/δ is not more than 120%.

The fourth invention is the structure in the first invention, wherein the peak intensity ratio γ/δ is not more than 110%.

According to this structure, the plasma resistance can be further increased.

The fifth invention is the structure in the invention 1, wherein the structure further includes a polycrystalline substance of yttrium fluoride, when taking a peak intensity detected near diffraction angle $2\theta=24.3°$ by X-ray diffraction as α, and taking a peak intensity detected near diffraction angle 2θ=25.7° as β, a peak intensity ratio α/β is not less than 0% and less than 100%.

According to this structure, the plasma resistance can be further increased.

The sixth invention is the structure in one of the inventions 1 to 5, wherein the average crystallite size is less than 50 nanometers.

The seventh invention is the structure in one of the inventions 1 to 5, wherein the average crystallite size is less than 30 nanometers.

The eighth invention is the structure in one of the inventions 1 to 5, wherein the average crystallite size is less than 20 nanometers.

According to these structures, since the average crystallite size is small, particles generated by plasma from the structures can be small.

The ninth invention is the structure in the invention 1, wherein when taking a peak intensity detected near diffraction angle 2θ=29.1° by X-ray diffraction as ε, a proportion of the ε to the δ is less than 1%.

The tenth invention is the structure in the second invention, wherein when taking a peak intensity detected near diffraction angle 2θ=29.1° by X-ray diffraction as ε, a proportion of the ε to the α is less than 1%.

According to these structures, since $Y_2O_3$ included in the structure is slight, fluoridation by CF-based plasma is suppressed and the plasma resistance can be further increased.

The eleventh invention is the structure in one of the inventions 1 to 10, wherein no peak is detected near diffraction angle 2θ=29.1° by X-ray diffraction. When taking a peak intensity detected near diffraction angle 2θ=29.1° by X-ray diffraction as ε, a proportion of the ε to the α is 0%.

According to this structure, since $Y_2O_3$ is substantially not included, fluoridation by CF-based plasma is suppressed and the plasma resistance can be further increased.

Various embodiments will be described hereinafter with reference to the accompanying drawings. In the drawings, similar components are marked with like reference numerals, and a detailed description is omitted as appropriate.

FIG. 1 is a cross-sectional view illustrating a member including a structure according to an embodiment.

As shown in FIG. 1, a member 10 is a composite structure including, for example, a base 15, and a structure 20.

The member 10 is, for example, a member for a semiconductor manufacturing apparatus including a chamber, and is provided inside the chamber. Since a gas is introduced inside the chamber and plasma is produced, the member 10 is required to be plasma resistant. The member 10 (structure 20) may be used for other than the inside of the chamber, and the semiconductor manufacturing apparatus includes an arbitrary semiconductor manufacturing apparatus (semiconductor processing apparatus) performing processing such annealing, etching, sputtering, CVD or the like. The member 10 (structure 20) may be used for a member other than the semiconductor manufacturing apparatus.

The base 15 includes alumina, for example. However, a material of the base is not limited to ceramics such as alumina, and may be quartz, alumite, metal or glass or the like. In this example, the member 10 including the base 15 and the structure 20 is described. An aspect of only the structure 20 without the base 15 is also encompassed in the embodiment. An arithmetic average roughness Ra (JISB0601:2001) of a surface of the base 15 (surface on which the structure 20 is formed) is, for example, less than 5 micrometers (μm), preferably less than 1 μm, more preferably less than 0.5 μm.

The structure 20 includes a polycrystalline substance of a compound including yttrium (Y) and fluorine (F). Specifically, the structure 20 includes at least one of yttrium fluoride ($YF_3$) and yttrium oxyfluoride. A main component of the structure 20 is yttrium oxyfluoride having an orthorhombic crystal structure. Or, the main component of the structure 20 may be $YF_3$ having an orthorhombic crystal structure.

In the specification of the application, the main component of the structure refers to a compound included relatively more than other compounds included in the structure 20 from quantitative or a semi-quantitative analysis by X-ray diffraction (XRD) of the structure. For example, the main component is the most abundant compound included in the structure, and a proportion of the main component in the entire structure is greater than 50% by volume ratio or mass ratio. The proportion of the main component is more preferably greater than 70% and greater than 90%. The proportion of the main component may be 100%.

Yttrium oxyfluoride is a compound of yttrium, oxygen (O) and fluorine, and, for example, includes YOF of 1:1:1 (molar ratio is Y:O:F=1:1:1), YOF of 1:1:2 (molar ratio is Y:O:F=1:1:2). In the specification of the application, a range of Y:O:F=1:1:2 is not limited to composition of Y:O:F being precisely 1:1:2, and may include composition of a molar ratio of fluorine to yttrium (F/Y) being greater than 1 and less than 3. For example, supposing yttrium oxyfluoride of Y:O:F=1:1:2, $Y_5O_4F_7$ (molar ratio is Y:O:F=5:4:7), $Y_6O_5F_8$ (molar ratio is Y:O:F=6:5:8), $Y_7O_6F_9$ (molar ratio is Y:O:F=7:6:9), $Y_{17}O_{14}F_{23}$ (molar ratio is 17:14:23) are included. The range of yttrium oxyfluoride may include compositions other than the above.

Figures 4, 5:
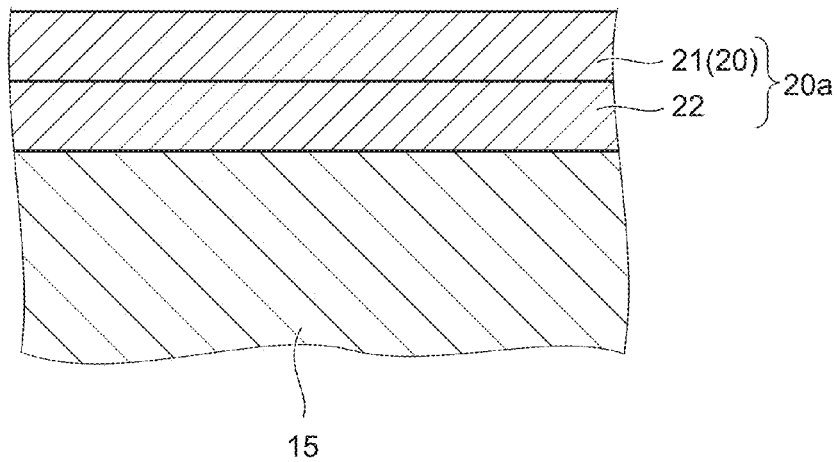
FIG. 4 is a table illustrating samples of the structure.
FIG. 5 is a cross-sectional view illustrating a member of another structure of the embodiment.

In the example of FIG. 1, the structure 20 has a single layer structure, however the structure formed on the base 15 may include a multilayer structure (see FIG. 5). For example, another layer 22 (for example, a layer including $Y_2O_3$) may be provided between the base 15 and a layer 21 corresponding to the structure 20 in FIG. 1. The layer 21 corresponding to the structure 20 forms the surface of a structure 20a having the multilayer structure.

The structure 20 is formed, for example, of a source material including yttrium fluoride or yttrium oxyfluoride. This source material is manufactured, for example, by fluoridation treatment of yttria. Powder used as the source material of the structure 20 according to the embodiment includes at least one of $YF_3$ and yttrium oxyfluoride, and may include or may not include yttrium oxyfluoride ($Y_5O_4F_7$, $Y_7O_6F_9$ or the like) depending on a degree of fluoridation in the manufacturing process of the source material. In the case where sufficient fluoridation treatment is performed in the manufacturing process of the source material, the source material does not include $Y_2O_3$ and YOF (molar ratio is Y:O:F=1:1:1). The embodiment may include the case where $Y_2O_3$ and YOF (molar ratio is Y:O:F=1:1:1) are not included. The fact that the source material and the structure include an orthorhombic yttrium oxyfluoride is supposed to mean that a peak is detected at least one of near of the diffraction angle 2θ=32.0° and near of the diffraction angle 2θ=32.8° in the X-ray diffraction. The fact that the source material and the structure include an orthorhombic yttrium fluoride is supposed to mean that a peak is detected at least one of near the diffraction angle 2θ=24.3° and near the diffraction angle 2θ=25.7° in the X-ray diffraction.

The inventors of the application have found that in the case of the structure 20 including the orthorhombic yttrium oxyfluoride, the plasma resistance can be increased by control of the structure of yttrium oxyfluoride.

Specifically, the high plasma resistance can be obtained by setting a peak intensity ratio γ/δ of the X-ray diffraction to be not less than 0% and not more than 150%, preferably not more than 120%, more preferably not more than 110%. Here, the peak intensity ratio γ/δ is calculated as below.

Firstly, the X-ray diffraction (θ-2θ scanning) is performed on the structure 20 including yttrium oxyfluoride. Taking the peak intensity detected near the diffraction angle 2θ=32.0° by the X-ray diffraction as γ and taking the peak intensity detected near the diffraction angle 2θ=32.8° by the X-ray diffraction as δ, the peak intensity ratio γ/δ (ratio of γ to δ) is calculated.

Near 2θ=32.0° is, for example, approximately 32.0±0.4° (not less than 31.6° and not more than 32.4°), and near 32.8° is, for example, appropriately 32.8±0.4° (not less than 32.4° and not more than 33.2°).

The inventors of the application have found that in the case of the structure 20 including the orthorhombic $YF_3$, the plasma resistance can be increased by control of the structure of $YF_3$.

Specifically, high plasma resistance can be obtained by setting a peak intensity ratio α/β of the X-ray diffraction to be not less than 0% and less than 100%. Here, the peak intensity ratio α/β is calculated as below.

Firstly, the X-ray diffraction (θ-2θ scanning) is performed on the structure 20 including $YF_3$. Taking the peak intensity detected near the diffraction angle 2θ=24.3° by the X-ray diffraction as α and taking the peak intensity detected near the diffraction angle 2θ=25.7° by the X-ray diffraction as β, the peak intensity ratio α/β (ratio of α to β) is calculated.

Near 2θ=24.3° is, for example, approximately 24.3±0.4° (not less than 23.9° and not more than 24.7°), and near 25.7° is, for example, appropriately 25.7±0.4° (not less than 25.3° and not more than 26.1°).

In the polycrystalline substance of the compound including yttrium and fluorine, the polycrystalline substance being included in the structure 20, an average crystallite size is, for example, less than 100 nm, preferably less than 50 nm, further preferably less than 30 nm, most preferably 20 nm. Since the average crystallite size is small, particles generated by plasma can be small.

The X-ray diffraction can be used for measurement of the crystallite size.

The crystallite size can be calculated by the following Scheller's formula as the average crystallite size.

$$D = K\lambda/(\beta \cos \theta)$$

Here, D is a crystallite size, β is a peak half width (radian (rad)), θ is a Bragg angle (rad), and λ is a wavelength of the X-ray used for the measurement.

In the Scheller's formula, β is calculated from β=(βobs−βstd). βobs is a half width of the X-ray diffraction peak of a measurement sample, and βstd is a half width of the X-ray diffraction peak of a reference sample. K is a Scheller constant. The X-ray diffraction peaks which can be used for calculation of the crystallite size in oxyfluoride of yttrium are, for example, a peak due to orthorhombus of oxyfluoride of yttrium near the diffraction angle 2θ=28.1° and a peak due to orthorhombus of oxyfluoride of yttrium near the diffraction angle 2θ=46.9° or the like. The X-ray diffraction peak which can be used for calculation of the crystallite size in yttrium fluoride is, for example, a peak due to orthorhombus of yttrium fluoride near the diffraction angle 2θ=25.7°, a peak due to orthorhombus of yttrium fluoride near the diffraction angle 2θ=27.8°, and a peak due to orthorhombus of yttrium fluoride near the diffraction angle 2θ=30.8° or the like.

The crystallite size may be calculated from an image of TEM observation or the like. For example, an average value of a diameter equivalent to a circle of the crystallite can be used for the average crystallite size.

Figure 6:
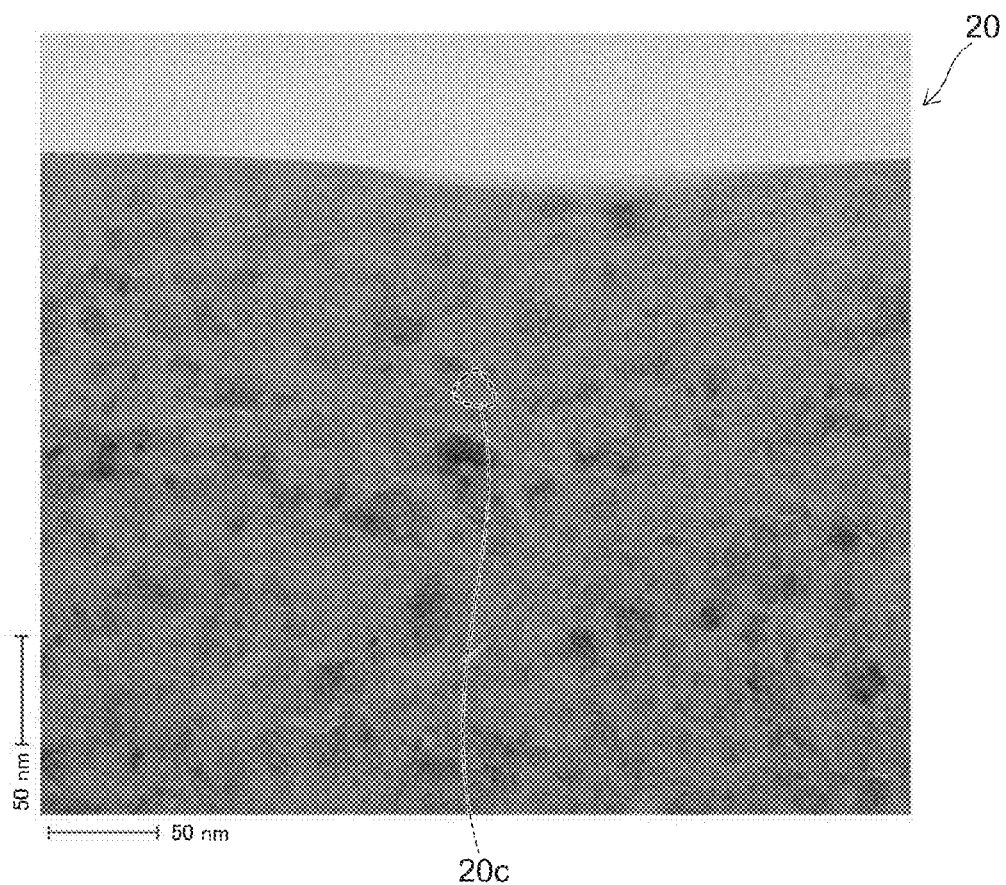
FIG. 6 is a photograph illustrating the structure according to the embodiment.

A spacing between adjacent crystallites each other is preferably not less than 0 nm and less than 10 nm. The spacing between adjacent crystallites is a spacing between the most adjacent crystallites, and does not include a gap formed from multiple crystallites. The spacing between the crystallites can be determined from the image obtained by the observation using a transmission electron microscope (TEM). FIG. 6 shows a TEM image of the observation of one example of the structure 20 according to the embodiment. The structure 20 includes multiple crystallites 20c (crystal particle).

For example, the structure 20 does not substantially include $Y_2O_3$. A peak intensity due to $Y_2O_3$ detected near the diffraction angle θ=29.1° on the X-ray diffraction in the θ-2θ scanning of the structure 20 is taken as ε. At this time, a proportion of ε to δ (ε/δ) is not less than 0% and less than 1%. Or a proportion of ε to α (ε/α) is not less than 0% and less than 1%. The structure 20 does not include $Y_2O_3$, or $Y_2O_3$ included in the structure 20 is slight, and thus fluoridation by CF-based plasma is suppressed and the plasma resistance can be further increased. Near 2θ=29.1° is approximately 29.1±0.4° (not less than 28.7° and not more than 29.5°).

The structure 20 according to the embodiment can be formed by disposing fine particles of a brittle material or the like on the surface of base 15 and giving a mechanical impact force to the fine particles. Here, "giving mechanical impact force" method includes, for example, use of a compressive force by a shock wave generated at an explosion based on a brush or a roller of high hardness rotating at a high speed or a piston moving up and down at a high speed, or operation of an ultrasonic acoustic wave, or a combination of those.

The structure 20 according to the embodiment is preferably formed by, for example, an aerosol deposition method as well.

"The aerosol deposition method" is a method in which "aerosol" including the dispersed fine particles including a brittle material or the like into a gas is injected toward the base from a nozzle, the fine particles are collided to the base such as a metal, glass, ceramics, plastics or the like, deformation and crushing are caused to occur on the brittle material fine particles by the impact of the collision and these are bonded, and the structure (for example, layered structure or film-like structure) including constituent material of the fine particles is directly formed on the base. According to this method, it is possible to form the structure at the normal temperature without particular necessity of heating means and cooling means, and is possible to obtain the structure having a mechanical strength equal to or more than that of the sintered body. It is possible to change variously the density, the mechanical strength, and the electrical characteristics or the like of the structure by controlling the condition of collision of the fine particles, and shapes and compositions or the like of the fine particles.

In the specification of the application, "polycrystal" refers to the structure made by bonding/accumulating the crystal particles. A diameter of the crystal particle is, for example, not less than 5 nanometers (nm).

In the specification of the application, "fine particles" refers to particles having an average particle diameter of not more than 5 micrometers (μm), which is identified by a particle distribution measurement or a scanning electron microscope in the case of a primary particle being a dense particle. In the case of the primary particle being a porous particle which tends to be crushed by the shock, it refers to particles having an average particle diameter of not more than 50 μm.

In the specification of the application, "aerosol" indicates a solid/gas mixed phase body including the previously described particles dispersed in a gas (carrier gas) such as helium, nitrogen, oxygen, dry air, a mixed gas including those, and refers to a state in which the particles are substantially dispersed alone, although "aggregate" is included in some cases. Although a gas pressure and a temperature of the aerosol are arbitrary, it is desired for formation of the structure that a concentration of the particles in the gas is within a range of 0.0003 mL/L to 5 mL/L at injection from the discharge port in the case where the gas pressure is converted 1 atmospheric pressure, the temperature is converted to 20 degrees Celsius.

One feature of the process of the aerosol deposition is that it is performed ordinarily at the normal temperature, and it is possible to form the structure at a sufficiently lower temperature than a melting point of the fine particle material, namely not higher than a several hundred degrees Celsius.

In the specification of the application, "normal temperature" refers to an extremely lower temperature to a sintering temperature of ceramics, and a room temperature environment of substantially 0 to 100° C.

In the specification of the application, "powder" refers to a state in which the previously described fine particles are naturally aggregated.

In the following, the discussion of the inventors of the application will be described.

FIG. 2 is a table illustrating the source materials of the structure.

In the discussion, 11 types of powder of the source materials F1 to F11 shown in FIG. 2 are used. These source materials are powders including $YF_3$. The source materials F5 to F11 contain oxygen in a range of not more than 11.2 (weight percent concentration: wt %), and include YOF of 1:1:2 (for example, yttrium oxyfluoride such as $Y_5O_4F_7$, $Y_7O_6F_9$). On the other hand, since these source materials include a relatively small amount of oxygen content, $Y_2O_3$ and YOF (molar ratio is Y:O:F=1:1:1) are not included substantially.

Substantially not including $Y_2O_3$ means that in the X-ray diffraction, a peak intensity due to $Y_2O_3$ near the diffraction angle 2θ=29.1° is less than 1%, preferably 0%, of a peak intensity due to YOF of 1:1:2 near the diffraction angle 2θ=32.8°, or a peak intensity due to $YF_3$ near the diffraction angle 2θ=24.3°.

Substantially not including YOF (molar ratio is Y:O:F=1:1:1) means that in the X-ray diffraction, a peak intensity due to YOF (molar ratio is Y:O:F=1:1:1) near the diffraction angle 2θ=13.8° or 36° is less than 1% of a peak intensity due to YOF of 1:1:2 near the diffraction angle 2θ=32.8° or a peak intensity due to $YF_3$ near the diffraction angle 2θ=24.3°. Near the 2θ=13.8° is for example, approximately 13.8±0.4° (not less than 13.4° and not more than 14.2°). Near the 2θ=36° is for example, approximately 36±0.4° (not less than 35.6° and not more than 36.4°).

The source materials F1 to F11 are different one another in a particle diameter like a median size (D50 (μm)) shown in FIG. 2. The median size is a diameter of 50% in a cumulative distribution of particle diameters of the respective source materials. The diameters of the respective particles are based on diameters determined in a circular approximation.

Samples of multiple structures (layered structure) are fabricated by changing the combination of these source materials and film manufacturing condition (type of flow rate of carrier gas), and the plasma resistance is evaluated. In this example, the aerosol deposition method is used for fabrication of the samples.

FIG. 3 is a table illustrating samples of the structure.

As shown in FIG. 3, nitrogen ($N_2$) or helium (He) is used for a carrier gas. The aerosol is obtained by mixing the carrier gas and source material powder (source material fine particle) in an aerosol generator. The obtained aerosol is injected by a pressure difference from a nozzle connected to the aerosol generator toward the base disposed inside a film manufacturing chamber. At this time, air in the film manufacturing chamber is evacuated to outside by a vacuum pump. The amount of flow rate of nitrogen is 2.5 (litter/minute: L/min) to 10 (L/min), and that of helium is approximately 5 (L/min).

Each of the structures of the samples 1 to 24 includes a polycrystalline substance of a compound including mainly yttrium and fluorine. In the embodiment, the average crystallite size in any polycrystalline substance is less than 100 nm.

The X-ray diffraction is used for measurement of the crystallite size.

The XRD device of "X'PertPRO/PANalytical made" is used. A tube voltage of 45 kV, a tube current of 40 mA, Step Size of 0.033°, Time per Step of not less than 366 seconds are used.

The crystallite size by the Scheller's formula described above is calculated as the average crystallite size. As a value of K in the Scheller's formula, 0.94 is used.

The X-ray diffraction is used for measurement of a main component of crystal phase of yttrium oxyfluoride and yttrium fluoride. The XRD device of "X'PertPRO/PANalytical made" is used. X-ray Cu-Kα (wavelength 1.5418 Å), a tube voltage of 45 kV, a tube current of 40 mA, Step Size of 0.033°, Time per Step of not less than 100 seconds are used. XRD analytical software "High Score Plus/PANalytical made" is used for calculation of the main component. The calculation is performed from a relative intensity ratio obtained on performing peak search to diffraction peaks by using a semi-quantitative value (RIR=Reference Intensity Ratio) described in ICDD card. In the measurement of the main component of crystal phase of yttrium oxyfluoride and yttrium fluoride, it is desired to use measurement results of a depth region less than 1 μm from the outermost surface by thin film XRD.

The crystal structure of yttrium fluoride is evaluated by using the X-ray diffraction. The XRD device of "X'PertPRO/PANalytical made" is used. X-ray Cu-Kα (wavelength 1.5418 Å), a tube voltage of 45 kV, a tube current of 40 mA, and Step Size of 0.017° are used. It is preferable that Time per Step is not less than 700 seconds in order to improve measurement accuracy. The ratio α/β about the peak intensity of orthorhombus in yttrium fluoride is calculated by α/β×100(%) by using the peak intensity (α) due to orthorhombus of yttrium fluoride near the diffraction angle 2θ=24.3° and the peak intensity (β) due to orthorhombus of yttrium fluoride near the diffraction angle 2θ=25.7°. The peak intensity (α) due to orthorhombus of yttrium fluoride near the diffraction angle 2θ=24.3° is due to, for example, a mirror plane (100) of $YF_3$. The peak intensity (β)

due to orthorhombus of yttrium fluoride near the diffraction angle 2θ=25.7° is due to, for example, a mirror plane (020) of $YF_3$.

In all of the samples 1 to 24, no peak with intensity is detected near the diffraction angle 2θ=29.1°. That is, subtracting intensity of background, a ratio (ε/δ) of the peak intensity ε to the peak intensity δ is 0%, or a ratio (ε/α) of the peak intensity ε to the peak intensity α is 0%, and the samples 1 to 24 do not include $Y_2O_3$.

The respective samples 1 to 11, 14 to 19 include orthorhombic yttrium fluoride (polycrystal of $YF_3$). In these respective samples, a peak is detected near the diffraction angle 2θ=24.3°, and a peak is detected near the diffraction angle 2θ=25.7°.

About the respective samples, in data of X-ray diffraction, the peak intensities (α and β) previously described are calculated subtracting the intensity of the background, and the peak intensity ratio α/β is determined. The determined peak intensity ratio α/β is shown in FIG. 3.

As shown in FIG. 3, the peak intensity ratio α/β changes greatly depending on the combination of the source material and the film manufacturing condition.

The plasma resistance is evaluated on these samples 1 to 24.

A plasma etching apparatus and a surface shape measurement instrument are used for the evaluation of plasma resistance.

The plasma etching apparatus of "Muc-21 Rv-Aps-Se/Sumitomo Precision Products made" is used. The condition of the plasma etching is set as follows, about a power output, an ICP output is 1500 W, a bias output is 750 W, a process gas is a mixed gas of $CHF_3$ 100 ccm and $O_2$ 10 ccm, a pressure is 0.5 Pa, a plasma etching time is 1 hour.

A surface roughness measurement instrument of "SUR-FCOM 1500DX/TOKYO SEIMITSU made" is used. The arithmetic average roughness Ra is used for an index of surface roughness. The reference value fitting to the arithmetic average roughness Ra of the measurement result is used based on JISB0601 for Cut Off and evaluation length in the measurement of the arithmetic average roughness Ra.

The plasma resistance is evaluated from a surface roughness change amount ($Ra_1-Ra_0$) by using a surface roughness $Ra_0$ before the plasma etching of the sample and a surface roughness $Ra_1$ after the plasma etching of the sample.

FIG. 3 shows evaluation results of the plasma resistance. "O" indicates the plasma resistance equal to or higher than that of the sintered body of yttria. "double circle" indicates the plasma resistance higher than that of "O" and equal to or higher than that of the yttria structure fabricated by the aerosol deposition method. "x" indicates the plasma resistance lower than that of "O" and, for example, lower than that of the sintered body of yttria.

The inventors of the application have found that the plasma resistance is improved by controlling the peak intensity ratio α/β to be less than 100% as shown in FIG. 3.

That is, the plasma resistance is improved by making the peak intensity (β) of the (020) plane of $YF_3$ relatively higher than the peak intensity (α) of the (100) plane.

In the case where the structure of the oxide such as $Al_2O_3$ and $Y_2O_3$ or the like is formed by using the aerosol deposition method in general, it is known that the structure has no crystal orientation.

On the other hand, since $YF_3$ and yttrium oxyfluoride are cleavable, for example, the fine particle of the source material tends to break along a cleavage plane by the mechanical shock being given. Therefore, it is considered that the fine particle breaks along the cleavage plane on film manufacturing by the mechanical impact force, and the structure orientates along the specific crystal direction.

In the case where the source material is cleavable, there is a fear that if the structure is damaged by plasma irradiation, cracks occur along the cleavage plane, and the particles are generated from this. Then, the fine particles are crushed in advance along the cleavage plane on forming the structure, and the orientation is regulated. Specifically, the peak intensity (β) of the (020) plane is made high as described previously. Thereby, it is considered that the plasma resistance can be improved.

FIG. 4 is a table illustrating samples of the structure.

FIG. 4 shows the samples 12 to 24 described with reference to FIG. 3. In FIG. 4, the source material, the film manufacturing condition and the plasma resistance are the same as the descriptions about FIG. 3.

The crystal structure of yttrium oxyfluoride is evaluated by using the X-ray diffraction. The XRD device of "X'PertPRO/PANalytical made" is used. X-ray Cu-Kα (wavelength 1.5418 Å), a tube voltage of 45 kV, a tube current of 40 mA, and Step Size of 0.067° are used. It is preferable that Time per Step is not less than 700 seconds in order to improve measurement accuracy. The proportion γ/δ about the peak intensity of orthorhombus in yttrium oxyfluoride is calculated by γ/δ×100(%) by using the peak intensity (γ) due to orthorhombus of yttrium oxyfluoride near of the diffraction angle 2θ=32.0° and the peak intensity (δ) due to orthorhombus of yttrium oxyfluoride near the diffraction angle 2θ=32.8°.

The peak intensity (γ) due to orthorhombus of yttrium oxyfluoride near the diffraction angle 2θ=32.0° is due to, for example, mirror planes (002), (1 12 0), (0 14 0) of $Y_7O_6F_9$, and mirror planes (171), (0 10 0) of $Y_5O_4F_7$. The peak intensity (δ) due to orthorhombus of yttrium oxyfluoride near the diffraction angle 2θ=32.8° is due to, for example, a mirror plane (200) of $Y_7O_6F_9$, and a mirror plane (200) of $Y_5O_4F_7$.

The respective samples 12 to 24 include orthorhombic yttrium oxyfluoride (for example, polycrystals of $Y_5O_4F_7$ and/or $Y_7O_6F_9$). In these respective samples, a peak is detected near the diffraction angle 2θ=32.0°, and a peak is detected near the diffraction angle 2θ=32.8°.

About the respective samples, in data of X-ray diffraction, the peak intensities (γ and δ) previously described are calculated subtracting the intensity of the background, and the peak intensity ratio γ/δ is determined. The determined peak intensity ratio γ/δ is shown in FIG. 4.

As shown in FIG. 4, the peak intensity ratio γ/δ changes greatly depending on the combination of the source material and the film manufacturing condition. The inventors of the application have found that the plasma resistance can be improved by controlling the peak intensity ratio γ/δ to be not more than 150%, preferably not more than 120%, more preferably not more than 110% as shown in FIG. 4.

In general, both of fluorine gas and oxygen gas are used in the chamber of the etching apparatus. In this environment, both reactions of fluoridation and oxidation occur. In the case where the structure includes $Y_2O_3$ or $YF_3$, fluoridation and oxidation proceed over time. The structure becomes to yttrium oxyfluoride finally, and thus the chamber environment is stabilized in some cases. For this reason, if the structure includes yttrium oxyfluoride in advance, the chamber environment can be stabilized earlier. It is considered that the plasma resistance can be improved by controlling the peak intensity ratio γ/δ to regulate the orientation.

The embodiment of the invention has been described with reference to specific examples. However, the invention is not limited to these specific examples. For example, those skilled in the art can suitably modify the above embodiment or examples also encompassed within the scope of the invention as long as they fall within the spirit of the invention. For example, the shape, the dimension, the material, the disposition or the like of the structure and the base or the like are not limited to the illustration and can be modified appropriately.

The components included in the respective embodiments previously described can be combined within the extent of the technical feasibility and these combinations are also encompassed in the scope of the invention as long as they fall within the feature of the invention.

What is claimed is:

1. A structure including a polycrystalline substance of yttrium oxyfluoride as a main component, the yttrium oxyfluoride having an orthorhombic crystal structure, and an average crystallite size of the polycrystalline substance being less than 100 nanometers, when taking a peak intensity detected near diffraction angle $2\theta=32.0°$ by X-ray diffraction as $\gamma$, and taking a peak intensity detected near diffraction angle $2\theta=32.8°$ as $\delta$, a peak intensity ratio $\gamma/\delta$ being not less than 0% and not more than 150%.

2. The structure according to claim 1, wherein the peak intensity ratio $\gamma/\delta$ is not more than 120%.

3. The structure according to claim 1, wherein the peak intensity ratio $\gamma/\delta$ is not more than 110%.

4. The structure according to claim 1, wherein the structure further includes a polycrystalline substance of yttrium fluoride, when taking a peak intensity detected near diffraction angle $2\theta=24.3°$ by X-ray diffraction as $\alpha$, and taking a peak intensity detected near diffraction angle $2\theta=25.7°$ as $\beta$, a peak intensity ratio $\alpha/\beta$ being not less than 0% and less than 100%.

5. The structure according to claim 1, wherein the average crystallite size is less than 50 nanometers.

6. The structure according to claim 1, wherein the average crystallite size is less than 30 nanometers.

7. The structure according to claim 1, wherein the average crystallite size is less than 20 nanometers.

8. The structure according to claim 1, wherein when taking a peak intensity detected near diffraction angle $2\theta=29.1°$ by X-ray diffraction as $\varepsilon$, a proportion of the $\varepsilon$ to the $\delta$ is less than 1%.

9. The structure according to claim 1, wherein when taking a peak intensity detected near diffraction angle $2\theta=29.1°$ by X-ray diffraction as $\varepsilon$, a proportion of the $\varepsilon$ to the $\alpha$ is 0%.

* * * * *